United States Patent [19]
Yamazaki et al.

[11] Patent Number: 5,913,112
[45] Date of Patent: Jun. 15, 1999

[54] METHOD OF MANUFACTURING AN INSULATED GATE FIELD EFFECT SEMICONDUCTOR DEVICE HAVING AN OFFSET REGION AND/OR LIGHTLY DOPED REGION

[75] Inventors: Shunpei Yamazaki, Tokyo; Yasuhiko Takemura; Hongyong Zhang, both of Kanagawa, all of Japan

[73] Assignee: Semiconductor Energy Laboratory Co., Ltd., Kanagawa, Japan

[21] Appl. No.: 08/209,063

[22] Filed: Mar. 11, 1994

Related U.S. Application Data

[60] Division of application No. 07/933,810, Aug. 24, 1992, Pat. No. 5,308,998, which is a continuation-in-part of application No. 07/846,164, Mar. 5, 1992, Pat. No. 5,289,030.

[30] Foreign Application Priority Data

Aug. 26, 1991 [JP] Japan .................................. 3-238713
Jan. 21, 1992 [JP] Japan .................................. 4-030220

[51] Int. Cl.$^6$ ............................ H01L 21/00; H01L 21/84
[52] U.S. Cl. ........................................ 438/165; 438/154
[58] Field of Search ............................ 257/66, 351, 408, 257/410; 437/40, 44, 21, 907, 908, 913, 197, 201, 909, 917, 170, 983, 101; 148/DIG. 53, DIG. 117; 438/149, 151, 153, 154, 164, 165

[56] References Cited

U.S. PATENT DOCUMENTS

| | | | |
|---|---|---|---|
| 3,775,262 | 11/1973 | Heyerdahl | 257/411 |
| 3,890,363 | 6/1975 | Harada et al. | 257/752 |
| 3,890,636 | 6/1975 | Harada et al. | 357/68 |
| 4,075,653 | 2/1978 | Howard | 357/23 |
| 4,455,737 | 6/1984 | Godejahn, Jr. | |

(List continued on next page.)

FOREIGN PATENT DOCUMENTS

| | | | |
|---|---|---|---|
| 0072216 | 2/1983 | European Pat. Off. | 437/907 |
| 58-32466 | 2/1983 | Japan | 437/187 |
| 58-81972 | 5/1983 | Japan | 257/66 |
| 58-95814 | 6/1983 | Japan . | |
| 58-115864 | 7/1983 | Japan | 257/66 |
| 58-124273 | 7/1983 | Japan | 257/66 |
| 58-158967 | 9/1983 | Japan | 257/66 |
| 59-214262 | 12/1984 | Japan | 437/197 |
| 62-124769 | 6/1987 | Japan | 257/59 |
| 3-34433 | 2/1991 | Japan | 437/907 |

OTHER PUBLICATIONS

Ghandi, S., "VLSI Fabrication Principles", John Wiley & Sons, New York, 1983, pp. 401–411.
Wolf et al., Silicon Processing, Lattice Press, vol. 1, 1986, pp. 151–154.
Wolf, Silicon Processing, Lattice Press, 1990, vol. 2, pp. 66–72.
Hidemi Ando, Patent Abstracts of Japan, Section E, Section No. 1060, vol. 15, No. 161, p. 128, Apr. 23, 1991.
Patent Abstracts of Japan, Section E, Section No. 1060, vol. 15, No. 161, p. 128 (Apr. 23, 1991).
Patent Abstracts of Japan, Section E, Section No. 1060, vol. 15, No. 161, p. 128 (Apr. 23, 1991).
Sorab K. Ghandi, VLSI Fabrication Principles, Silicon and Gallium Arsenide, pp. 401–410, 1983.

*Primary Examiner*—Brian Dutton
*Attorney, Agent, or Firm*—Sixbey, Friedman, Leedom & Ferguson, P.C.; Gerald J. Ferguson, Jr.; Jeffrey L. Costellia

[57] ABSTRACT

An LDD structure is manufactured to have a desired aspect ratio of the height to the width of a gate electrode. The gate electrode is first deposited on a semiconductor substrate followed by ion implantation with the gate electrode as a mask to form a pair of impurity regions. The gate electrode is then anodic oxidized to form an oxide film enclosing the electrode. With the oxide film as a mask, highly doped regions are formed by ion implantation in order to define lightly doped regions between the highly doped regions and the channel region located therebetween.

5 Claims, 10 Drawing Sheets

U.S. PATENT DOCUMENTS

| | | | |
|---|---|---|---|
| 4,468,855 | 9/1984 | Sasaki | 29/576 B |
| 4,557,036 | 12/1985 | Kyuragi et al. | 257/412 |
| 4,616,399 | 10/1986 | Ooka | 437/44 |
| 4,646,426 | 3/1987 | Sasaki | 29/571 |
| 4,727,044 | 2/1988 | Yamazaki | 437/45 |
| 4,746,628 | 5/1988 | Takafuji et al. | 437/187 |
| 4,769,338 | 9/1988 | Ovshinsky et al. | 437/39 |
| 4,822,751 | 4/1989 | Ishizu et al. | 437/173 |
| 4,868,137 | 9/1989 | Kubota | 437/41 |
| 4,900,695 | 2/1990 | Takahashi et al. | 437/195 |
| 4,905,066 | 2/1990 | Dohjo et al. | 257/412 |
| 5,097,311 | 3/1992 | Iwase et al. | 257/412 |
| 5,112,764 | 5/1992 | Mitra et al. | 437/40 |
| 5,126,283 | 6/1992 | Pintchovski et al. | 437/188 |
| 5,134,093 | 7/1992 | Onishi et al. | 437/197 |
| 5,142,344 | 8/1992 | Yamazaki et al. | 257/66 |
| 5,165,075 | 11/1992 | Hiroki et al. | 359/59 |
| 5,258,319 | 11/1993 | Inuishi et al. | 437/35 |
| 5,272,361 | 12/1993 | Yamazaki | 257/66 |
| 5,289,030 | 2/1994 | Yamazaki et al. | 257/410 |
| 5,306,651 | 4/1994 | Matsumoto et al. | 437/40 |

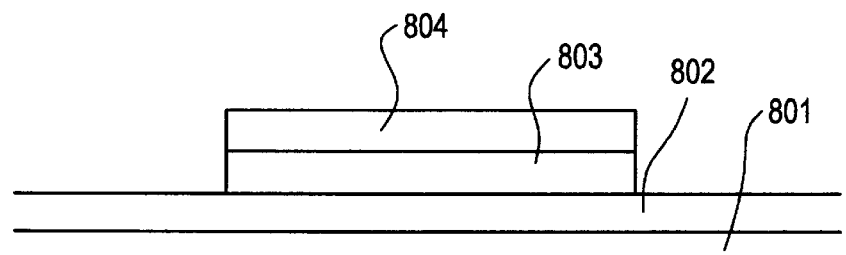
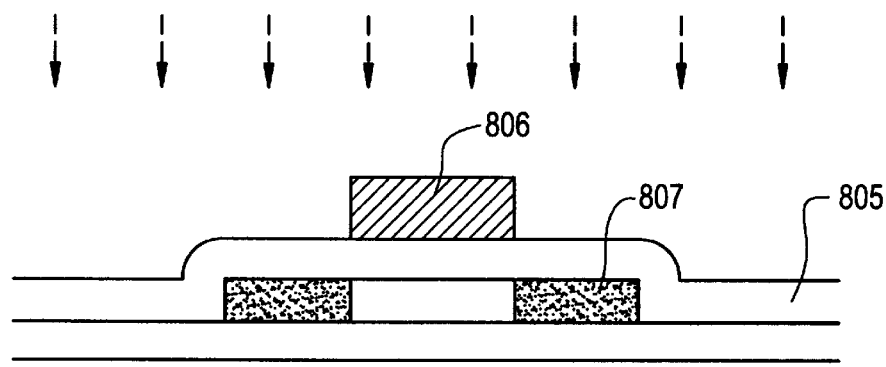
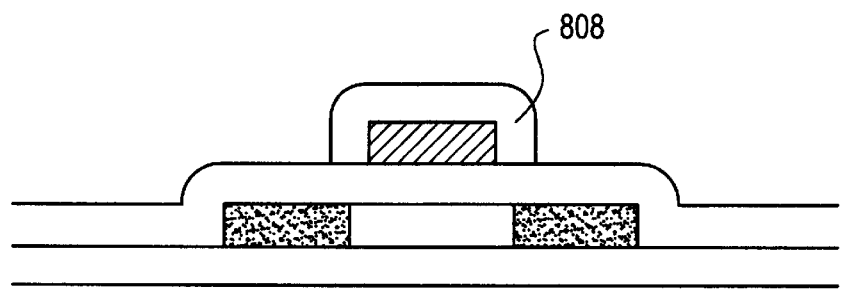
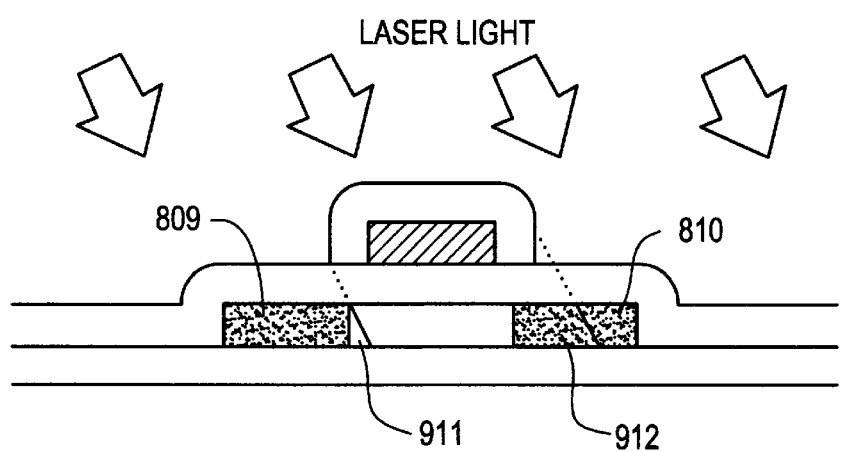

METHOD OF MANUFACTURING AN INSULATED GATE FIELD EFFECT SEMICONDUCTOR DEVICE HAVING AN OFFSET REGION AND/OR LIGHTLY DOPED REGION

This is a divisional of Ser. No. 07/933,810, filed Aug. 24, 1992 now U.S. Pat. No. 5,308,998; which is a continuation-in-part of Ser. No. 07/846,164, filed Mar. 5, 1992, now U.S. Pat. No. 5,289,030.

BACKGROUND OF THE INVENTION

1. Field of the Invention

The present invention relates in general to an insulated gate field effect semiconductor device and method of manufacturing the same.

2. Description of the Prior Art

A variety of approaches have been carried out in order to miniaturize integrated circuits and achieve a higher packing density in a chip. Particularly, remarkable advances have been reported in the development of the technology to miniaturize insulated gate field effect semiconductor devices, denoted as MOSFET for short. MOS is the acronym of Metal Oxide Semiconductor. The metal used in MOSFETs generally includes, in addition to genuine metals, conductive materials such as semiconductors having a sufficient conductivity, alloys composed of semiconductor(s) and/or metal(s). The oxide generally includes, in addition to genuine oxides, insulating materials having a sufficient resistivity such as nitrides. Although these materials do exactly not correspond to the acronym MOS, the term MOSFET is used in the broad sense in this description.

The miniaturizing of MOSFETs is realized by decreasing the width of the gate electrode. The decrease of the width of the gate electrode leads to the decrease of the channel length underlying the gate electrode. This also results in a high operational speed because the short channel length decreases the time required for carriers to pass across the channel.

The miniaturizing, on the other hand, gives rise to other problems, i.e. short channel effects. One of the most serious problems thereof is hot electron effects. In the structure comprising highly doped source and drain regions with an inversely doped intervening channel region therebetween, the strength of the electric field at the boundary between the channel region and the highly doped region increases as the channel length decreases. As a result, the characteristics of the device are unstable.

The LDD (lightly-doped-drain) structure has been proposed to solve the above problem. This structure is schematically illustrated in FIG. 1(D). In the figure, reference numeral 207 designates a lightly doped region formed inside of a highly doped region 206. The region 207 is called a LDD region. By provision of such a LDD region, the strength of the electric field in the vicinity of the boundary between the channel region and the drain region is decreased so that the operation of the device becomes more stable.

FIGS. 1(A) to 1(D) are cross sectional views showing a method of making a conventional MOSFET. Although an n-channel transistor is explained here, a p-channel transistor is formed in the same manner only by inverting the conductivity type. A semiconductor film is deposited onto an insulating substrate and patterned in order to define a semiconductor active region. An oxide film and a conductive film are deposited on the semiconductor film and patterned by etching in order to form a gate electrode 201 insulated by a gate insulating film 202. With the gate electrode 201 and the insulating film 202 as a mask, lightly doped regions 203 are formed by ion implantation in a self-aligning manner.

Next, the structure is coated with an insulating film 204 such as a PSG film. The insulating film 204 is removed by an anisotropic etching (directional etching) leaving spacers 205 flanking the gate electrode 201. With the spacers 205 as a mask, heavily doped regions 206 are formed to provide source and drain regions. By employing this LDD design, the channel length can be decreased to as short as 0.1 micrometer while the channel length in usual designs can not be decreased to 0.5 micrometer or shorter.

The problems associated with the short channel designs, however, are not completely solved by this technique. Another problem is the resistance of the gate electrode which has become narrow. Even if the switching speed of the device is increased by the short channel, the speed-up may possibly come to naught due to propagation delay along the high resistant gate electrode. The resistance of the gate electrode can be decreased to some extent by employing a metal silicide having a low resistivity in place of polysilicon to form the gate electrode or by providing a low resistant line such as an aluminum line extending along the gate electrode. These techniques, however, can not solve the high resistance problem when the width of the gate electrode is no larger than 0.3 micrometer.

Another approach to solve the problem is to increase the aspect ratio of the gate electrode, i.e. the ratio of the height to the width of the gate electrode. The resistance of the gate electrode decreases in proportion to the cross sectional area which increases as the aspect ratio increases. From the view point of manufacture restraints, the aspect ratio can not be increased so much. This is mainly because the width of the spacers depend on the height of the gate electrode. The spacer is formed with its width of 20% or wider of the height of the gate electrode. Accordingly if 0.1 micrometer width L (FIG. 1(D)) is desired, the height of the gate electrode can not exceed 0.5 micrometer. If the gate electrode has a height exceeding 0.5 micrometer, the width L exceeds 0.1 micrometer resulting in a higher resistance between the source and drain regions.

In the case of 0.5 micrometer height (h), 1.0 micrometer width (W) and 0.1 micrometer width (L) in FIG. 1(D), if the width (W) of the gate electrode is desired to be decreased to 0.5 micrometer, the height of the electrode must be increase to 1.0 micrometer in order to avoid increase of the gate resistance. The width (L) of the spacers, however, becomes 0.2 micrometer so that the resistance between the source and drain regions is doubled. The halved channel length is expected to improve double the operational speed. The increase of double the source and drain resistance, however, cancels the improvement. Accordingly, the operational speed remains same as achieved before the shrinkage in size.

Usually, the width of the spacer becomes as wide as 50% to 100% of the height of the gate electrode, which width provides a further severe condition. The aspect ratios of the gate electrodes, therefore, have been no higher than 1, or in many cases no higher than 0.2 in accordance with the conventional LDD technique. In addition to this, the width of the spacer has been substantially dispersed, due to expected variations of production, which results in dispersed characteristics of the products. The conventional LDD technique has brought high integrations and high speeds and, on the contrary, impeded further improvement.

On the other hand, recently, semiconductor integrated circuits have been formed within semiconductor thin films deposited on insulating substrates such as glass substrates (e.g., in the case of liquid crystal displays and image sensors) or on single crystal semiconductor substrates coated with insulating films (e.g., in the case of three-dimensional ICs). The LDD technique is often effective also in these cases. Because of disparity of thickness of one PSG film formed over a large glass substrate, the sizes of spacers become different depending upon the positions of the substrate.

In the case of LDD designs to be formed on an insulating surface for three-dimensional ICs, if there have been formed other circuits under the surface, the surface is usually not even so that the sizes of spacers are substantially dispersed. The yield of the conventional productions of three-dimensional ICs has therefore been low with dispersed characteristics.

BRIEF SUMMARY OF THE INVENTION

It is an object of the present invention to provide a method of manufacturing an insulated gate field effect semiconductor device within a small area which has a high switching speed and a low on-state resistance.

It is another object of the present invention to provide a method of manufacturing an insulated gate field effect semiconductor device having LDD regions which are short as compared with the height of the gate electrode.

It is a further object of the present invention to provide an insulated gate field effect semiconductor device having a new structure equivalent to LDD regions.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, an insulated gate field effect semiconductor device is manufactured by the steps of forming a conductive pattern on a semiconductor substrate through a gate insulating film, introducing an impurity into the semiconductor substrate with the conductive pattern as a mask, oxidizing an external surface of the conductive pattern to leave a gate electrode therein, and introducing an impurity into the semiconductor substrate with the oxidized conductive pattern as a mask.

The oxidation of the external surface of the conductive pattern can be carried out by anodic oxidation, a plasma oxidation (vapor phase oxidation) or a liquid phase oxidation. A bias voltage is applied to the conductive pattern or a lead connected thereto in the plasma oxidation or the liquid phase oxidation.

The present invention will be briefly explained with reference to FIGS. 2(A) to 2(C). Although an n-channel transistor is explained here, a p-channel transistor is formed in the same manner. A p-type silicon semiconductor thin film is deposited onto an insulating substrate and patterned in order to define a semiconductor active region. An oxide film and a conductive film are deposited on the semiconductor film and patterned by etching in order to form a conductive film 101 insulated by a gate insulating film 102 as illustrated in FIG. 2(A). The conductive film is made of, for example, titanium (Ti), aluminum (Al), tantalum (Ta), chromium (Cr) or an alloy consisting of two or more of these metals. With the gate electrode 101 and the insulating film 102 as a mask, lightly doped regions 103 are formed by ion implantation in a self-aligning manner. The doping concentration of the regions 103 is $1 \times 10^{17}$ to $5 \times 10^{18}$ cm$^{-3}$.

Next, the upper and side surfaces of the conductive film 101 are anodic oxidized to form a gate electrode 105 and an insulating oxide film 104 as illustrated in FIG. 2(B). The size of the gate electrode 105 is smaller than the size of the conductive film 101 because the surface portion of the film 101 is eaten by the oxidation to form the oxide film 104. Thickness of the oxide film 104 is preferably 200 to 3500 Å, more preferably 1000 to 2500 Å. The spacial relationship between the gate electrode 105 and the lightly doped regions 103 is very important. If there is a substantial area of the channel region which is not covered by the overlying gate electrode, the channel region might not form a sufficiently effective channel therein when the gate electrode is given a signal. On the contrary, if the gate electrode overlaps the lightly doped regions 103 too much, a substantial parasitic capacitance is formed resulting in a slow switching speed.

It is, however, not so difficult in accordance with the present invention to control the relationship. The spread of the dopant within the lightly doped regions 103 due to secondary scattering of the ion implantation can be controlled by adjusting the acceleration energy of ions. The shrinkage of the conductive film 101 due to the anodic oxidation is also controlled by adjusting the thickness of the oxide film, i.e. by adjusting the oxidation condition. The thickness of the oxide film 104 can be controlled within +10nm from a target thickness. The secondary scattering can be controlled at the same order accuracy. Namely, by accurately designing the respective dimensions, the optimum relationship between the lightly doped regions 103 and the gate electrode 105 can be achieved only with an error as small as 10 nm.

With the oxide film 104 as a mask, heavily doped regions 106 are formed by ion implantation to provide source and drain regions in accordance with self-aligning configuration as illustrated in FIG. 2(C). The doping concentration of the heavily doped regions 106 is $1 \times 10^{20}$ to $5 \times 10^{21}$ cm$^{-3}$. The inner portions of the lightly doped regions 103 is left as LDD structures 107 having same configuration and same function as a conventional LDD structure. The width L of the LDD regions is, however, determined by the thickness of the oxide film 104 but independent of the height of the gate electrode so that the aspect ratio of the gate electrode can be increased to exceed 1.

In accordance with the present invention, the width L of the LDD regions can be arbitrarily and finely adjusted from 10 nm to 0.1 micrometer. The overlapping dimension between the gate electrode 105 the LDD regions 107 can be controlled at a similar accuracy as explained above. The channel length W can be reduced to 0.5 micrometer or less in this case. Conventionally, it had been very difficult to form a LDD region having 100 nm or less width and the error had been usually 20% or thereabout. It becomes, however, possible to form LDD regions having 10 to 100 nm widths only with errors of about 10%.

Furthermore, in accordance with the present invention, the process is simplified because an insulating film need not be formed over the gate electrode in order to form spacers. The oxide film 104 formed by anodic oxidation is extremely uniform over the gate electrode and has a high resistivity. The formation of the oxide film can be carried out in the same manner wherever it is located on an uneven substrate.

The LDD structure 107 illustrated in FIG. 2(C) is same as that of the prior art LDD technique. A similar function can be realized by utilizing noncrystalline semiconductors such as amorphous or semiamorphous semiconductors. In such a case, the LDD regions 107 are composed of a noncrystal semiconductor material doped with an impurity while the heavily doped regions 106 are composed of an usual single crystalline or polycrystalline impurity semiconductor. The LDD regions and the heavily doped region may have the same doping concentration in this case. An appropriate terminator such as hydrogen or a halogen has to be introduced into the noncrystal semiconductor material in order to terminate dangling bonds occurring in the material. FIG. 3(D) illustrates an example of a MOSFET having such a LDD structure. The inventor discovered that this new type device utilizing a noncrystal semiconductor material exhibited improvement of characteristics of TFTs in the same manner as conventional LDD devices.

FIG. 4(A) is a graph showing the relationship between the gate voltage Vg and the drain current Id. Curve A is plotted in the case of the new type MOSFET device utilizing a noncrystal semiconductor. Curve B is plotted in the case of a conventional FET device with no LDD structure. In the case of the conventional device, the drain current increases also when −Vg increases. This undesirable characteristic is called reverse current leakage. When complementary FETs are formed, this is serious problem.

Contrary to this, the characteristic is improved by forming the noncrystal semiconductor regions as seen from curve A. The mechanism of the improvement has not certainly been understood yet. One assumption is thought that the effective doping concentration of the noncrystal region is lower than the actual doping concentration because the ionization rate in the noncrystal region is lower than that in the crystal region. For example, the ionization rate of amorphous silicon is 0.1 to 10% while that of single crystalline or polycrystalline silicon is approximately 100%.

Another assumption is based upon difference between the noncrystal and the crystal in band-gap. FIG. 4(B) illustrates the energy band structure of a semiconductor device with a LDD structure when no gate signal is supplied. FIG. 4(C) illustrates the energy band structure of a semiconductor device with a LDD structure when a large gate voltage is supplied in the reverse direction. In this case, small carrier leakage takes place through the device due to tunnel effects and hopping among trapping levels existing in the band-gap. The provision of the LDD structure is effective to increase the band-gap at the junctions so that the carrier leakage is suppressed as compared with a device having no LDD structure. The improvement due to the LDD structure is particularly remarkable when the FET is a thin film transistor (TFT) because a TFT utilizes a nonuniform semiconductor material such as polysilicon forming trapping levels therein which are considered to originate from grain boundaries.

The reverse current leakage is furthermore suppressed by increasing the band-gap of the LDD regions. FIG. 4(D) illustrates. the energy band structure of a semiconductor device with LDD regions having wide band-gaps when no gate signal is supplied. FIG. 4(E) illustrates the energy band structure of the same semiconductor device when a large gate voltage is supplied in the reverse direction. As shown in the figures, the band-gaps at the LDD regions are substantially increased as compared with the case shown in FIGS. 4(B) and 4(C). The probability of tunnel current through the LDD regions quickly decreases as the band-gap (barrier) increases. The hopping through local levels in the band-gap is also decreased by increasing the band-gap because the mechanism of hopping is also based upon combinational tunnel effects. For this reason, LDD structure having a wide band-gap is advantageous with respect to improvement of FET characteristics. In this sense, noncrystal semiconductor materials, e.g. amorphous silicon having 1.8 eV band-gap is considered to be useful for forming an equivalent structure whereas the band-gap of polysilicon is 1.1 eV.

The band-gap is increased also by introducing other suitable impurities such as carbon, nitrogen, oxygen and so forth into silicon semiconductors at appropriate stoichiometrical or non-stoichiometrical ratios in order to obtain the same effects. The impurities such as carbon, nitrogen, oxygen are not so desirable for silicon semiconductors so that low densities thereof is favorable in general. In accordance with the present invention, no such impurities are utilized. The densities of such impurities are desirably reduced to $7 \times 10^{19} \text{cm}^{-3}$ or less in the following embodiments in order to make excellent devices.

BRIEF DESCRIPTION OF THE DRAWINGS

The accompanying drawings, which are incorporated in and form a part of the invention and, together with the description, serve to explain the principles of the invention.

FIGS. 8(A) to 8(D) are cross sectional views showing a method of manufacturing a thin film field effect transistor having a new structure equivalent to LDD regions in accordance with a third embodiment of the present invention.

DETAILED DESCRIPTION OF THE PREFERRED EMBODIMENTS

Referring now to FIGS. 3(A) to 3(D), a method of manufacturing an n-channel thin film field effect transistor in accordance with a first embodiment of the present invention will be explained.

Figure 1A:
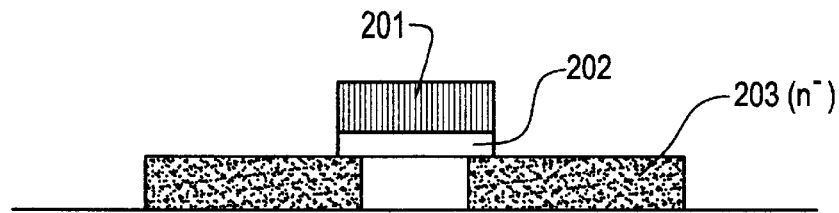
FIGS. 1(A) to 1(D) are cross sectional views showing a conventional method of manufacturing a thin film field effect transistor having LDD regions.
Figure 1B:
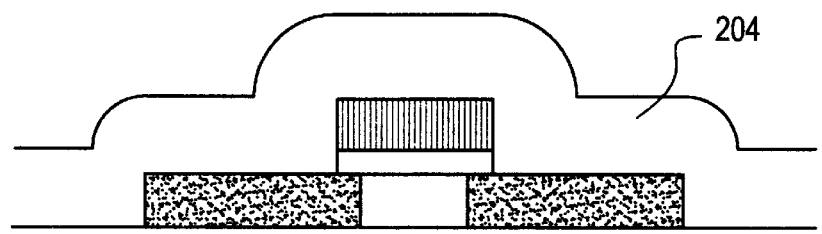
Figure 1C:
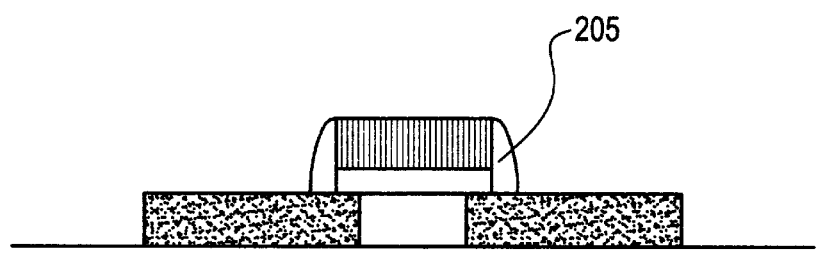
Figure 1D:
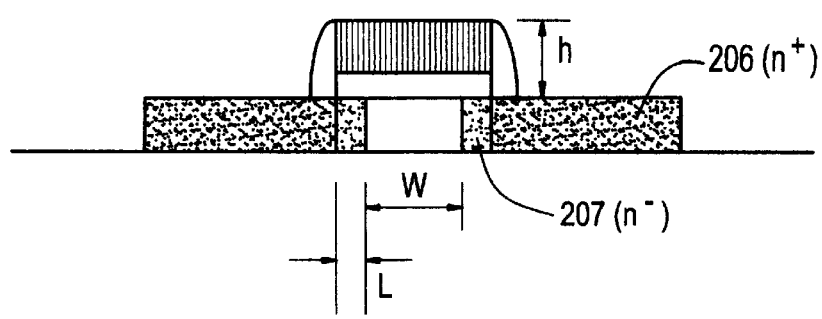
Figure 2A:
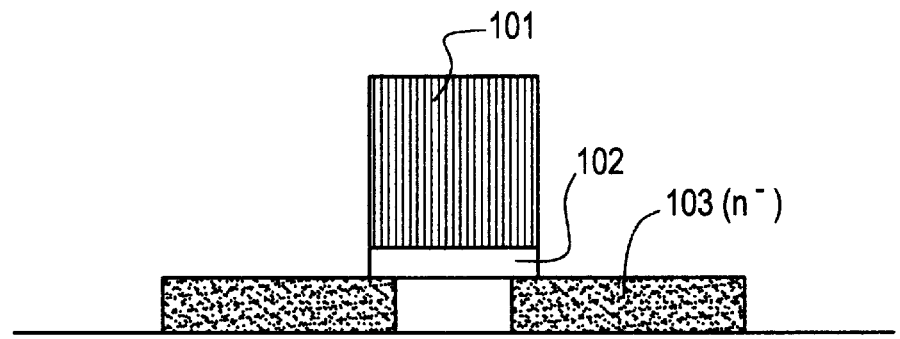
FIGS. 2(A) to 2(C) are cross sectional views showing basic steps of a method of manufacturing a thin film field effect transistor having LDD regions in accordance with the present invention.
Figure 2B:
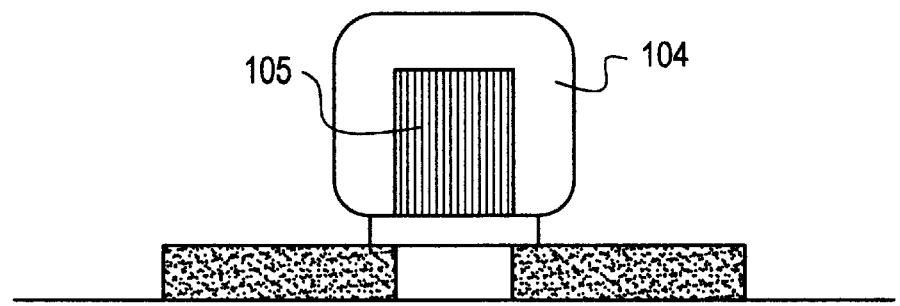
Figure 2C:
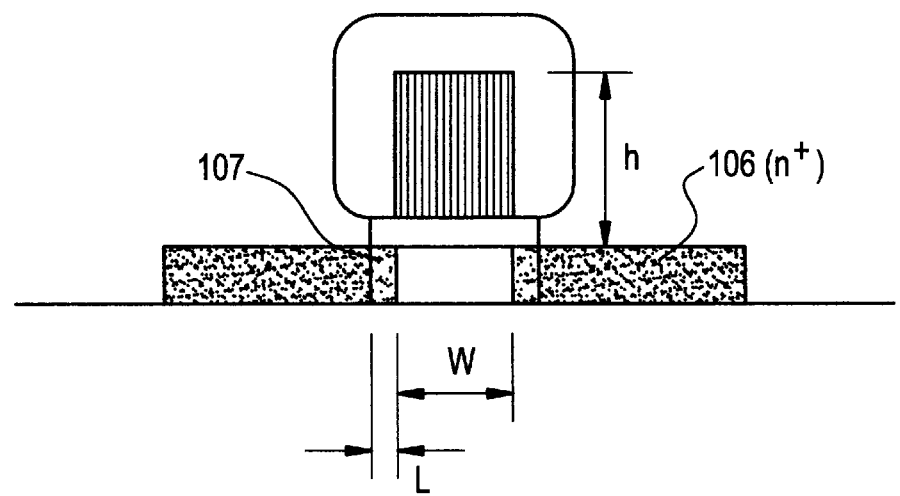
Figure 3A:
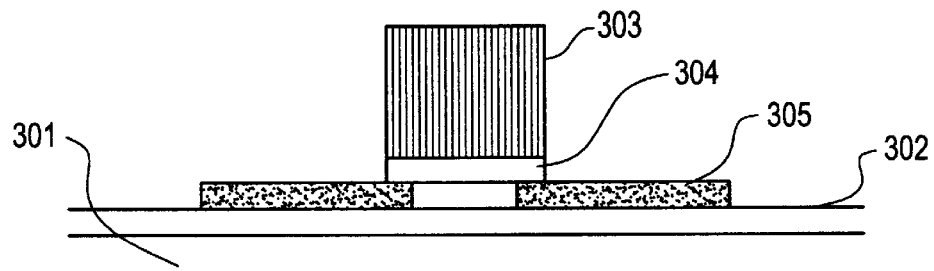
FIGS. 3(A) to 3(D) are cross sectional views showing a method of manufacturing a thin film field effect transistor having LDD regions in accordance with a first embodiment of the present invention.

A low temperature oxide film 302 is deposited on a quartz substrate 301 by low pressure CVD to a thickness of 10 to 500 nm, for example, 100 nm as illustrated in FIG. 3(A). An intrinsic amorphous silicon semiconductor film is deposited in the same manner over the oxide film 302 by low pressure CVD to a thickness of 10 to 100 nm, for example, 20 nm. Alternatively, by elevating the deposition temperature, the semiconductor film is deposited in a microcrystalline or polycrystalline phase instead of the amorphous phase. The amorphous semiconductor film may be deposited by plasma CVD or photo-CVD instead of low pressure CVD. A rectangular active region of 10 micrometers×30 micrometers is separated from the amorphous film by patterning and exposed to laser light emitted from a KrF excimer laser in order to crystallize the active region. The wavelength of the laser light is 428 nm. The pulse width is 10 nsec. The energy density is 150 to 250 mJ/cm$^2$, for example, 200 mJ/cm$^2$. The desired crystallization is completed by irradiation of 1 to 10 laser pulses.

A silicon oxide film is then deposited on the crystallized semiconductor film to a thickness of 50 to 150 nm, for example, 70 nm by ECR plasma CVD. An aluminum film is next deposited on the oxide film to a thickness of 100 to 800 nm, for example, 500 nm by electron beam vacuum evaporation. These oxide and aluminum films are patterned to form an aluminum pattern 303 to be a gate electrode and a gate insulating film 304. The lateral dimension of the pattern 303 and film 304 (in the right to left direction of the drawing) is 500 nm for example. Arsenic ions are introduced to the semiconductor film by ion implantation in order to form n-type impurity regions 305 having a doping concentration of $1 \times 10^{17}$ to $5 \times 10^{18}$ cm$^{-3}$, preferably $1 \times 10^{17}$ to $2 \times 10^{18}$ cm$^{-3}$, for example, $2 \times 10^{18}$ cm$^{-3}$. The ion implantation makes the impurity regions amorphous.

Figure 3B:
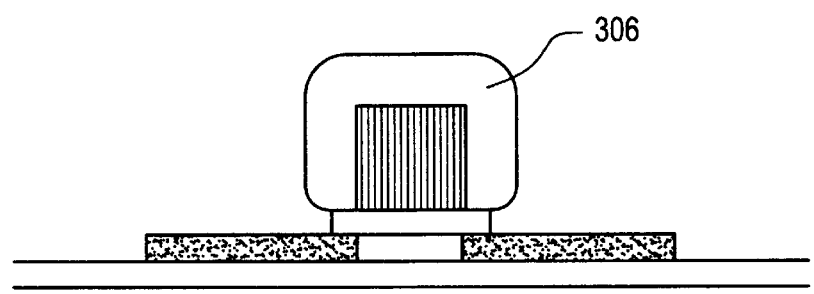
Figure 3C:
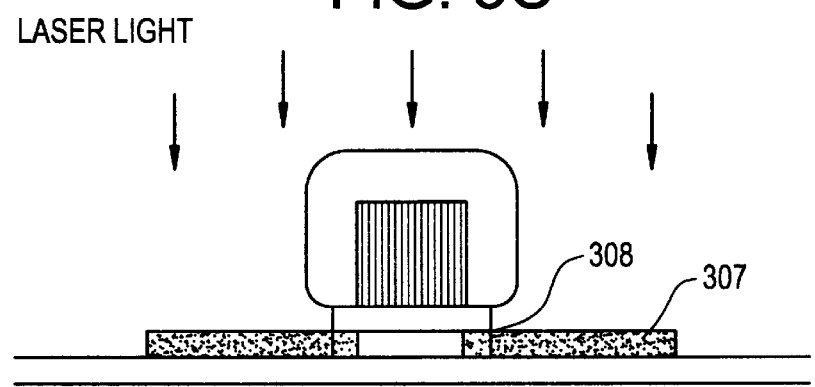

Next, as illustrated in FIG. 3(B), the upper and side surfaces of the aluminum pattern 303 are anodic oxidized to form an aluminum oxide film 306 of 200 nm thickness covering the pattern. The anodic oxidation is carried out, for example, by immersing the substrate in an electrolyte. The electrolyte is prepared by diluting L-tartaric acid with ethylene glycol and its pH is controlled to be 7.0±0.2 by adding ammonia thereto. A 20 mA DC current is passed through the electrolyte with the substrate as a positive electrode and a platinum plate as a negative electrode. The anodic oxidation is continued with the constant current of 20 mA whereas the voltage between the positive and negative electrode is increased to 100V. After the voltage reaches to 100V, the oxidation is further continued with the voltage maintained at 100V whereas the current is gradually reduced to 0.1 mA. Then, the aluminum oxide film 306 is formed enclosing the gate electrode therein. With the aluminum oxide film 306 as a mask, arsenic ions are introduced into the semiconductor film by ion implantation in order to form n$^+$-type impurity regions 307 outside of n$^-$-type regions 308. The doping concentration of the impurity regions 307 is $1 \times 10^{20}$ to $5 \times 10^{21}$ cm$^{-3}$, for example, $0.8 \times 10^{21}$ cm$^{-3}$.

Figure 3D:
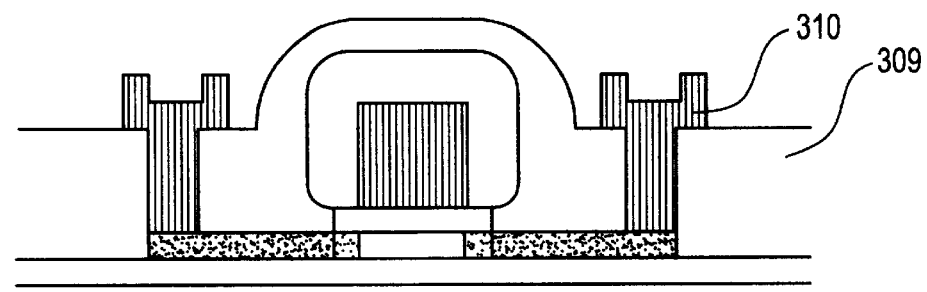

The impurity regions 307 are then exposed to laser light in order to crystallize the impurity regions 307, leaving the regions 308 noncrystalline, whose advantages have been already explained in SUMMARY OF THE INVENTION. During the laser exposure, the gate electrode is protected by the aluminum oxide film 306. The gate electrode might otherwise be expanded, melted or rubbed resulting in serious damage thereof. Even if the gate electrode is melted for a moment, its configuration is maintained by the enclosure of the aluminum oxide film resulting in no problem. The structure is next given passivation for 2 hours at 250° C. in hydrogen of atmospheric pressure in order to improve semiconductive characteristics of the respective regions of the semiconductor film by reducing the influence of local energy levels of the semiconductor film. A phosphosilicate glass film 309 is deposited over the structure by low pressure CVD at 450° C. The reactive gas used is composed of SiH$_4$, O$_2$ and PH$_3$. Finally, contact holes are opened through the phosphosilicate glass film 309 followed by forming aluminum electrodes in order to make contact with the impurity regions 307 through the contact holes. As a result, the formation of a thin film transistor comprising the LDD regions located between the drain and source regions and the channel region is completed as illustrated in FIG. 3(D). The channel width is 20 micrometers. The channel length is 500 nm between the noncrystal regions of 100 nm length corresponding to the thickness of the oxide film 306.

Actually, the gate electrode is an extension of a gate wiring also anodic oxidized and provided for supplying a gate signal. The oxide film coated over the gate wiring extending from the gate electrode is effective to prevent it from making short with other wirings. In the case of a matrix circuit for a liquid crystal display, for example, gate wirings are formed to intersect and be isolated from many other signal lines through an interlayer insulating film by grade separation (level crossing). However, the withstand voltage and uniformity of such an interlayer insulating film are low so that short current paths are often formed therethrough. The formation of such short current paths is a most serious problem to improve yield of liquid crystal matrices. In accordance with the present invention, since gate wirings are coated with a dense oxide film devoid of pinholes and having a large withstand voltage, the possibility of forming short current paths is very low and therefore the yield of liquid crystal displays is substantially improved.

Figure 4A:
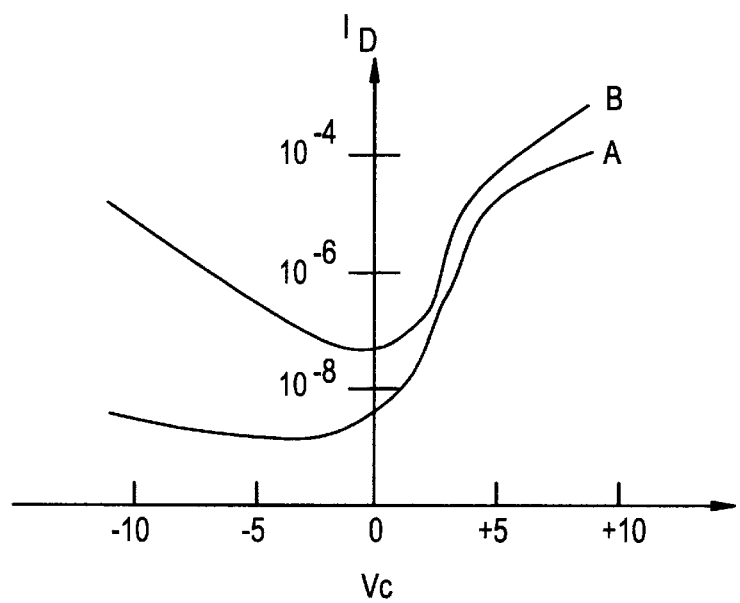
FIG. 4(A) is a graphic diagram showing the relationship between the drain current and the gate voltage of a prior art thin film field effect transistor having no LDD regions and a thin film field effect transistor having LDD regions in accordance with the present invention.
Figure 4B:
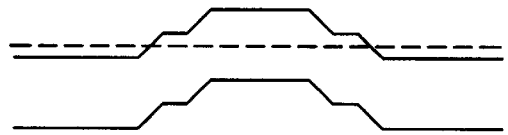
FIGS. 4(B) to 4(E) are energy band diagrams demonstrating the effect of LDD structures.
Figure 4D:
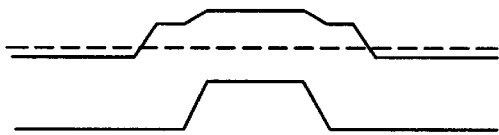
Figure 4C:
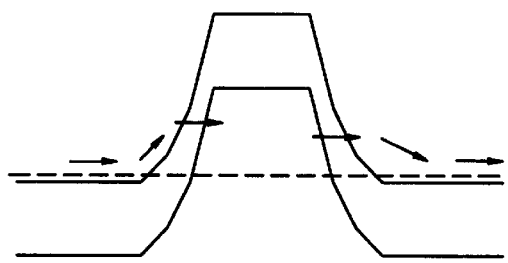
Figure 4E:
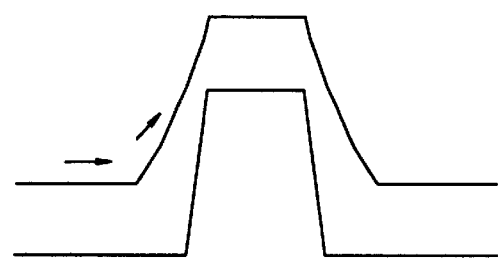

FIG. 4(A) is a graph showing the relationship between the drain current and the gate voltage. Curve A is plotted in the case of a thin film transistor having a channel region of 0.5 micrometer ×20 micrometers and noncrystal regions 308 of 0.1 micrometer width. Curve B is plotted in the case of a conventional thin film transistor having a channel region of 0.5 micrometer ×20 micrometers but not provided with noncrystal regions. 5V is applied between the source and the drain during the measurement for both cases. As shown in the figure, it will be understood that the present invention is effective to suppress not only reverse current leakage but also current leakage in off-state (Id with Ig=0). The later suppression is particularly important in the case of the application to active matrix liquid crystal displays because when current leakage is substantial in the off-state, electric charge escapes from capacitances associated with respective pixels.

Referring now to FIGS. 5(A) to 5(E), FIGS. 6(A) to 6(C) and FIGS. 7(A) to 7(C), initially to FIGS. 5(A) to 5(E), a method of manufacturing complementary thin film field effect transistors in accordance with a second embodiment of the present invention will be explained.

An intrinsic amorphous silicon semiconductor film is deposited on a substrate of Corning 7059 glass substrate to a thickness of 150 nm by plasma CVD and crystallized in nitrogen at 600° C. for 60 hours. A pair of island-shaped rectangular active regions 502 and 503 are separated from the amorphous film by patterning.

Figure 5A:
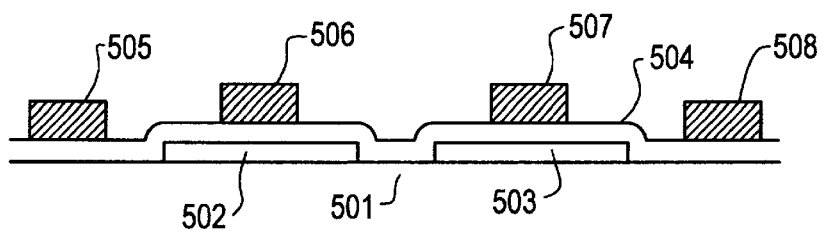
FIGS. 5(A) to 5(E) are cross sectional views showing a method of manufacturing a thin film field effect transistor having a new structure equivalent to LDD regions in accordance with a second embodiment of the present invention.
Figure 5B:
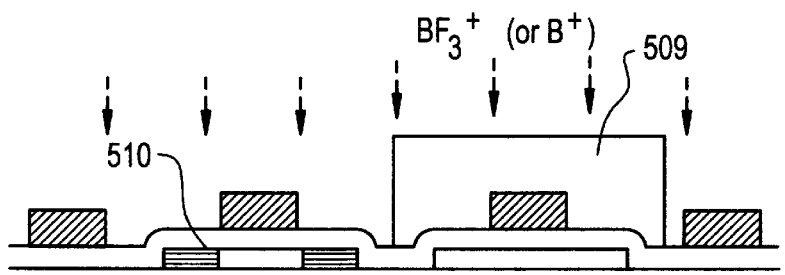
Figure 5C:
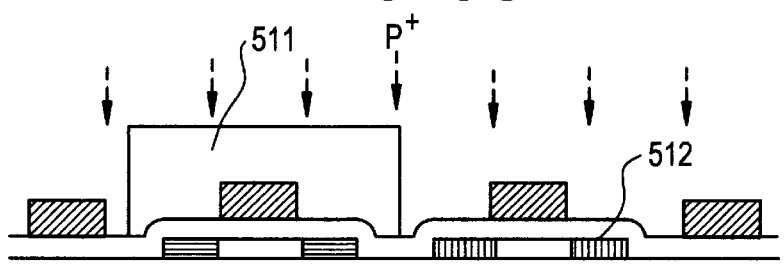

A silicon oxide film is then deposited on the substrate 501 over the active regions to a thickness of 115 nm by sputtering. An aluminum film is next deposited on the oxide film to a thickness of 100 to 800 nm, for example, 500 nm by electron beam vacuum evaporation. The aluminum film is patterned to form aluminum patterns 506 and 507 of 8 micrometers width (in the left to right direction) to be a gate electrode as illustrated in FIG. 5(A) and aluminum wirings 505 and 508 which are utilized for general purposes. After covering the active region 503 with a photoresist 509, boron ions ($B^+$) or boron fluoride ions ($BF_3^+$) are introduced to the active region 502 by ion implantation with the aluminum pattern 506 as a mask in order to form p-type impurity regions 510 having a doping concentration of $1 \times 10^{13}$ to $5 \times 10^{13}$ $cm^{-2}$. The ion energy is 70 to 100 keV. The impurity regions may be formed by directing a dopant plasma gas to the active region called as plasma doping. Anyway, the impurity regions are damaged by ion bombardment or plasma bombardment and their crystalline structure is broken into a substantially noncrystalline phase. After covering the active region 502 with a photoresist 511, phosphorus ions ($P^+$) are introduced to the active region 503 by ion implantation with the aluminum pattern 507 as a mask in order to form n-type impurity regions 512 in the same manner as illustrated in FIG. 5(C).

Figure 5D:
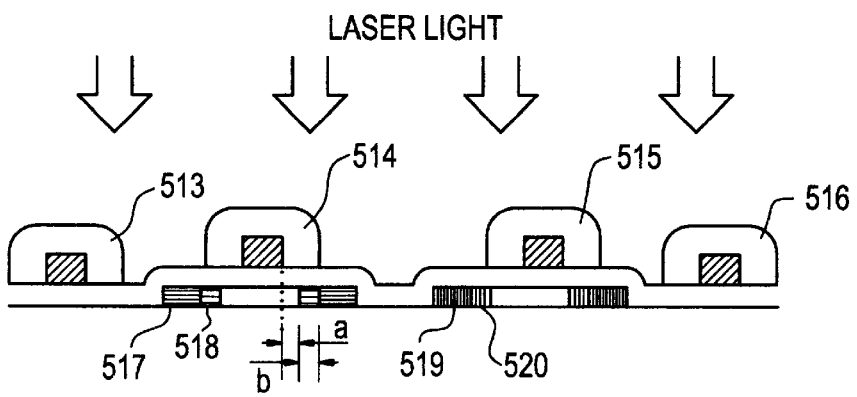
Figure 5E:
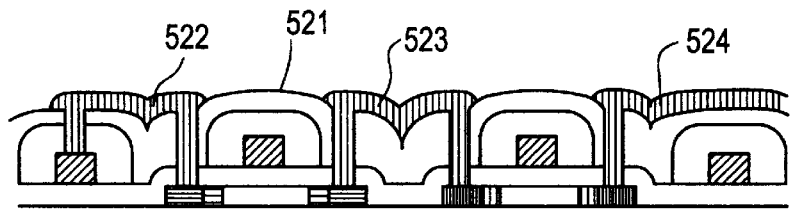

Next, as illustrated in FIG. 5(D), the upper and side surfaces of the aluminum patterns 506 and 507 and the wirings 505 and 508 are anodic oxidized to form aluminum oxide films 513 to 516 covering the exposed surfaces of these patterns and wirings. The anodic oxidation is carried out, for example, by immersing the substrate in an electrolyte at 24±2° C. The electrolyte is prepared by preparing an ethylene glycol solution of L-tartaric acid (3%) and neutralizing it (pH=7.0±0.2) by adding aqueous ammonia (5%) thereto. A DC current is passed through the electrolyte with these aluminum patterns and wirings as a positive electrode and a platinum plate as a negative electrode. These aluminum patterns and wirings have been formed to be electrically connected to each other so that connection with the positive terminal of a voltage source can be made at once. The integral connection of these aluminum patterns and wirings is only for this anoding, and therefore these patterns and wirings will be appropriately separated later for actual purposes of the electric circuit. The anodic oxidation is continued with the constant current of 0.5 mA whereas the voltage between the positive and negative electrodes is gradually increased. After the voltage reaches to 250V, the oxidation is further continued with the voltage maintained at 250V whereas the current is gradually reduced. When the current is reduced to 0.005 $mA/cm^2$, the oxidation is stopped by ceasing the current supply. Then, the aluminum oxide films 513 to 516 of a thickness of 320 nm are formed enclosing the gate electrodes and wirings as illustrated in FIG. 5(D). With the aluminum oxide films 514 and 515 as a mask, the impurity regions 510 and 512 are subjected to laser annealing by means of a KrF excimer laser to partially crystallize the impurity regions. During the laser annealing, the substrate 501 is mounted on an XY stage in air (at $10^2$ Torr or higher pressure). A flat laser beam of $1 \times 300$ $mm^2$ is moved with respect to the stage in order to completely irradiate the substrate from one edge to the opposite edge. The wavelength of the laser light is 428 nm. The pulse width is 10 nsec. The power density is 350 $mJ/cm^2$. The desired crystallization is completed by radiation of 50 laser pulses. During the laser annealing, the gate electrode is protected by the aluminum oxide films 513 to 516. The oxide films 513 to 516 function to prevent the laser beam from reaching the portions of the impurity regions 510 and 512 that located just under the oxide films. Noncrystal regions 518 and 520 are therefore left and defined aside the crystallized regions 517 as illustrated in FIG. 5(D). The dimension of the noncrystal regions 518 and 520 correspond to lateral increment caused by the oxidation of aluminum, as denoted by reference "b". The increment "b" is the thickness of the aluminum oxide film 514 minus the regression of the aluminum pattern denoted by reference "a". The regression "a" of the aluminum pattern is usually ⅓ to ½ of the thickness of the oxide film. In typical cases, "a" is selected to be 0.1 to 0.2 micrometer and "b" to be 0.03 to 0.2 micrometer so that desired characteristics are obtained. Accordingly, a pair of the wide-gap n-type (noncrystalline) regions are formed inside of the relatively narrow-gap n-type (crystallized) regions with a channel region therebetween as illustrated in the left side of FIG. 5(D). As illustrated in the right side of FIG. 5(D), a pair of the wide-gap p-type regions are also formed inside of the relatively narrow-gap p-type regions with a channel region therebetween in the same manner.

In accordance with experiments, during partial crystallization of the semiconductor film by the laser annealing, the aluminum oxide films 513 to 516 were sometimes observed with cracks, fissures, holes and aluminum which issued therethrough and consolidated because of the laser shock. The aluminum appearing from these defects was anodic oxidized again by means of the same electrolyte and electrodes in order to stop the defects opened through the oxide films. The current to be passed through the electrolyte must be carefully adjusted in this case. Since the area of aluminum exposed through the oxide film was very small as compared to the case of the previous oxidation, substantial heat was generated by concentration of the current to destruct the structure by chemical reactions (undesirable oxidation) when the current was supplied in the same manner as in the case of the previous oxidation. For this reason, the current was gradually increased, monitoring the voltage being applied. The typical level of the current to be initially applied was 1 to 5% of that of the previous oxidation. This initial current was 5 microampere/$cm^2$ for example. The voltage was elevated by 2V per minutes. When the voltage reached 250V, the current supply was ceased to complete the anodic oxidation. The appropriate level of the final (maximum) voltage depends on the thickness of the oxide film. Experiences of the inventors seemed to show that the maximum voltage be directly proportional to the thickness of the oxide film. Namely, 250V corresponds to 320 nm.

The defects of the insulation of the gate electrodes and the wirings can be eliminated in the above manner. The aluminum gate electrode and wirings, which have been integrally formed for the purpose of anodic oxidation, are then appropriately separated by laser processing in air in order to form the desired circuit. The laser employed in this process is a Q-switched Nd:YAG laser (1064 nm wavelength) excited by a flush lamp. For the purpose of this laser process, the second order harmonic waves are utilized (532 nm wavelength) in the form of pulses. The spot diameter of the laser pulses is 5 micrometers. The energy density of the laser pulses is 1KJ/$cm^2$. The pulse width is 5 nano seconds. The substrate is moved in a XY stage in order that the laser pulses are incident upon the sites to be separated. A well-known photolithography may be used instead of this laser processing depending upon the actual case. In general, from the view points of cost of massproduction, photolithography is suitable for such cases that there are many or wide sites to be processed or geometrically complicated sites to be processed whereas laser processing is suitable for such cases that the sites to be processed are geometrically simple or limited in area or not so many.

The substrate is then transported to the vacuum chamber of a CVD apparatus. An interlayer insulating film 521 made of silicon oxide is deposited in the chamber and contact holes are opened therethrough with a suitable photoresist pattern by etching which selectively removes part of the insulating film 521 and part of the aluminum oxide films 513. Accordingly, the etching rates to silicon oxide and aluminum oxide are desirably greater than those of silicon and aluminum. In the case of an etchant (buffered hydrofluoric acid) prepared for wet etching by mixing a water solution (40 wt%) of ammonium fluoride and a water solution (50 wt%) of hydrogen fluoride, which have been highly purified for use in semiconductor manufacture, the etching rates to aluminum oxide is 60 nm/min and that to aluminum 15 nm/min. On the other hand, in the case of the reactive ion etching by the use of carbon tetrafluoride, aluminum and aluminum oxide are hardly etched whereas silicon oxide is etched at 10 nm/min for example. As etching conditions for this reactive ion etching, for example; the gas flowing rate is 20 SCCM; the reaction pressure is 0.08 Torr; and RF power supplied is 100 W. By utilizing both the etching methods, the contact holes can be formed. Namely, the interlayer oxide film 521 and the oxide film 504 are partially removed by the reactive ion etching followed by the wet etching with the buffered hydrofluoric acid which partially removes the aluminum oxide films 513.

Finally, necessary metallic wirings are formed over the structure in order to make contact with the impurity regions 517 and 519 and the aluminum wirings 505. As a result, a pair of complementary MOSFETs comprising an n-type transistor and a p-type transistor are formed.

Figure 6A:
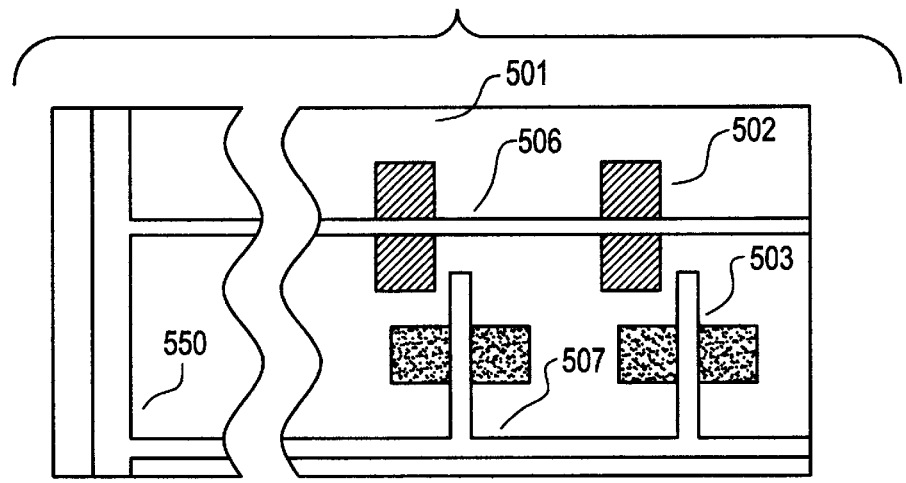
FIGS. 6(A) to 6(C) are plan views showing an application of the second embodiment of the present invention.
Figure 6B:
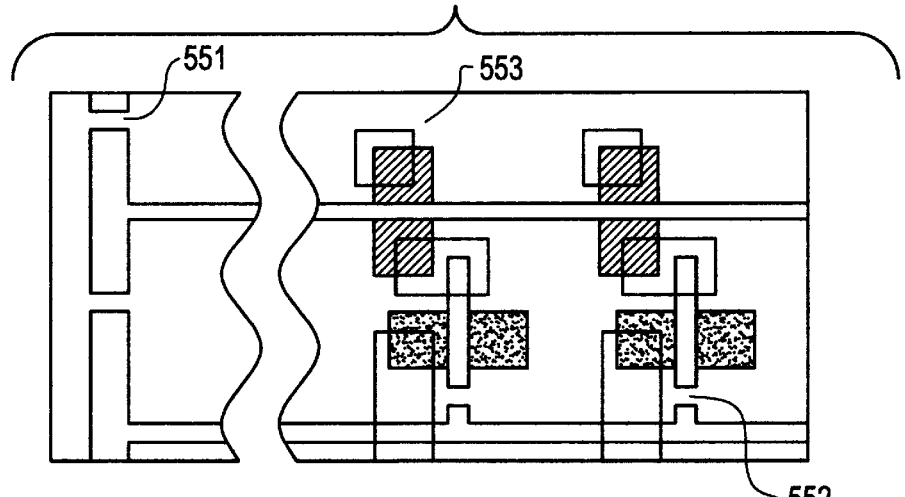
Figure 6C:
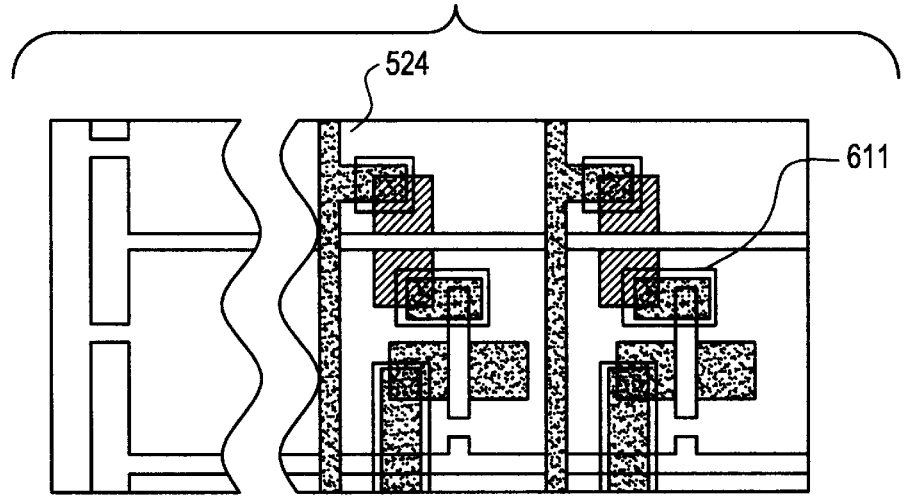
Figure 7A:
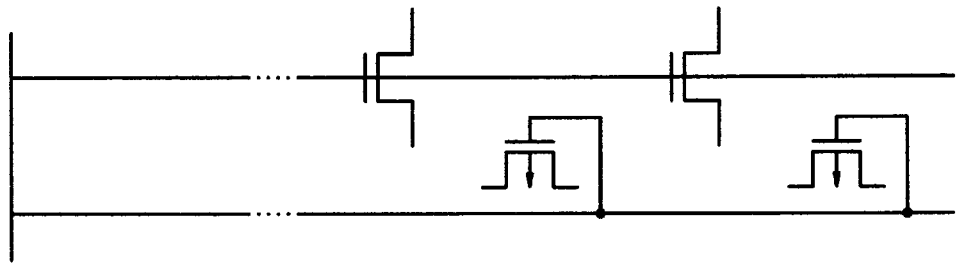
FIGS. 7(A) to 7(C) are circuit diagrams for explaining the application of the second embodiment of the present invention.
Figure 7B:
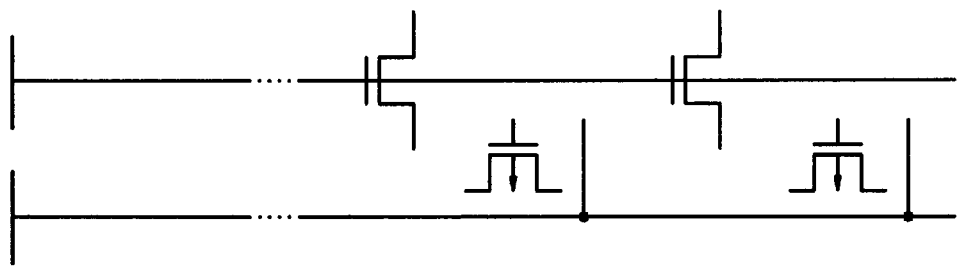
Figure 7C:
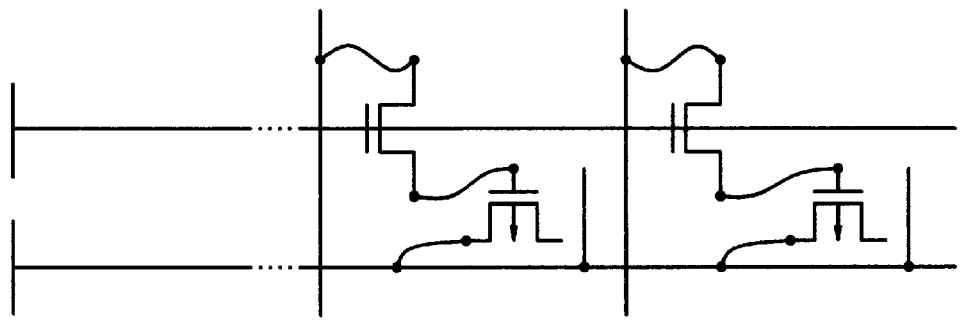

FIGS. 6(A) to 6(C) and FIGS. 7(A) to 7(C) illustrate an exemplary application of the above second embodiment for forming a switching circuit of a liquid crystal display. In the figures, only circuits for two pixels are shown for the purpose of explanation wherein the active regions comprising the sources, drains and channels for the n-channel transistor and the p-type transistor are illustrated as dashed and dotted areas respectively. FIGS. 6(A) and 7(A) correspond to FIG. 5(C) from which the mask 511 is removed. In this condition, the anodic oxidation is carried out by connecting the positive terminal of a voltage source to a common electrode 550 which are electrically coupled with all the aluminum patterns 505 to 508 so that the electrical connection to the patterns is made at once. The integral connection of the electrode 550 to the patterns are separated by laser processing as depicted by numerals 551 and 552 in FIG. 6(B) after the completion of the anodic oxidation. Employment of laser processing is appropriate in this case because the portions of the aluminum patterns to be removed are not so many and have small areas. Then, necessary wirings are formed by means of the metallic wirings 522, 523 and 524 (FIG. 5(E)) to complete the formation of the circuit as shown in FIG. 6(C). FIGS. 7(A) to 7(C) are circuit diagrams corresponding to FIGS. 6(A) to 6(C) respectively. N-type transistors on a same row are made conductive by supplying a gate signal through line 562 (FIG. 7(C)). By this condition, p-channel transistors on the same row are selectively made conductive in accordance with data signals supplied through lines 561 connected respectively to the gates of the p-channel transistors. Then, a high voltage supplied to line 563 is selectively transferred to the drain terminals of the p-channel transistors which are illustrated opened but connected to respective electrodes of pixels in the actual cases.

Referring next to FIGS. 8(A) to 8(D), a method of manufacturing a thin film field effect transistor in accordance with a third embodiment of the present invention will be explained.

A silicon oxide film 802 is deposited on a substrate 801 of Corning 7059 glass to a thickness of 100 nm by sputtering. An intrinsic amorphous silicon semiconductor film is then deposited on the oxide film 802 to a thickness of 50 nm by plasma CVD. Another silicon oxide film 804 is further deposited on the semiconductor film to a thickness of 20 nm by sputtering for the purpose of protection of the semiconductor film. The semiconductor film is then crystallized by thermal annealing in nitrogen at 600° C. for 72 hours. These semiconductor film and the silicon oxide film are partially removed to leave an island-shaped rectangular active region of 30 micrometers length in the left-right direction and 20 micrometers width normal to the drawing sheet as denoted by numerals 803 followed by removing the protective oxide film 804. The removal of the oxide film is carried out by the use of the etchant comprising the buffered hydrofluoric acid which has been explained for the previous second embodiment.

The structure is coated with a gate insulating film 805 of 115 nm thickness by sputtering in oxygen atmosphere with a target of silicon oxide. The gate insulating film 805 is next doped with phosphorous ions by plasma doping. This doping is carried out for the purpose of gettering of movable ions such as sodium ions existing in the gate insulating film. The plasma acceleration energy is 10 keV. The doping density is $2 \times 10^{14} cm^{-2}$. After the plasma doping, damage to the silicon semiconductor and oxide films is cured by annealing at 600° C. for 24 hours. This doping may be dispensed with if the density of such impurity ions is so low as not to hinder the normal operation of the device.

An aluminum film is next deposited on the oxide film 805 by sputtering and patterned to form an aluminum pattern 806 of 8 micrometers width (in the left to right direction) to be a gate electrode by patterning with an etchant prepared by adding 5% nitric acid to phosphoric acid. The etching rate is, for example, 225 nm/min at 40° C. With the aluminum pattern 806 as a mask, phosphorous ions are introduced to the semiconductor active region by ion implantation in order to form n-type impurity regions 807 having a doping concentration of $5 \times 10^{15} cm^{-2}$. The ion energy is 80 keV. The doping is carried out by through-implantation through the oxide film 805 as illustrated in the figure. The presence of the oxide film during the implantation guarantees the smoothness of the surface of the impurity regions 807 even when laser annealing is given to the impurity regions to crystallize them in a later step. The surfaces might become uneven, otherwise, due to a number of crystal seeds generated on the surfaces during the crystallization process. The structure as illustrated in FIG. 8(B) is obtained in this manner. The impurity regions 807 become noncrystalline, i.e. amorphous or polycrystal (nearly amorphous) due to the ion implantation.

Next, as illustrated in FIG. 8(C), the upper and side surfaces of the aluminum pattern 806 are anodic oxidized to form aluminum oxide film 808 covering the exposed surfaces of the pattern. The anodic oxidation is carried out, for example, by immersing the substrate in an electrolyte at 25±2° C. The electrolyte is prepared by preparing an ethylene glycol solution of L-tartaric acid (3%) and neutralizing it (pH=7.0±0.2) by adding aqueous ammonia (5%) thereto. A DC current is passed through the electrolyte with the aluminum pattern 806 as a positive electrode and a platinum plate as a negative electrode. The anodic oxidation is continued with the constant current of 0.5 mA whereas the voltage between the positive and negative electrodes is gradually increased. After the voltage reaches to 200V, the oxidation is further continued with the voltage maintained at 200V whereas the current is gradually reduced. When the current is reduced to 0.005 mA/cm², the oxidation is stopped by ceasing the current supply. Then, the aluminum oxide film 808 of a thickness of 250 nm is formed enclosing the gate electrode as illustrated in FIG. 8(C). With the aluminum oxide film 808 as a mask, laser annealing is carried out by means of a KrF excimer laser to partially crystallize the semiconductor active region. The power density is 350 mJ/cm². The desired crystallization can be completed only by one pulse. The pulse radiation, however, is desirably repeated in order to cope with variation of laser conditions. On the other hand, excessive annealing is not desirable from the view point of productivity. In practice, irradiation with 10 or thereabout pulses may be appropriate in many cases. The laser annealing can be carried out in air because the impurity regions are covered by the oxide film 805. If the impurity regions are exposed, the laser annealing must be carried out in vacuum in order to avoid entrance of oxygen which substantially degrades the characteristics of the device.

The laser pulses are projected in a slanting direction as illustrated in FIG. 8(D), e.g. at 10 degree angularly distant from the normal to the substrate. The angle is determined in accordance with the desired geometry of the structure. The crystallized impurity regions are asymmetrically formed in this manner. Namely, regions 809 and 810 are sufficiently crystallized. The region 911 adjacent to the crystallized region 809 has not been ion implanted but is crystallized by the laser pulses. The region 912 adjacent to the crystallized region 810 is a region which has been ion implanted but is not crystallized. Actually, the region 810 is designed to be a drain which is provided with the noncrystal region 912 for suppressing hot electron effects because hot electron effects are likely particularly in the vicinity of drain regions in general rather than in the vicinity of source regions.

Subsequent steps are carried out in the same manner as those for the second embodiment so that redundant explanation of details is omitted. Namely, an interlayer insulating film is deposited by sputtering followed by opening contact holes by photolithography and providing necessary electrodes and wirings.

In accordance with the present invention, the level of current leakage, the switching speed and the withstand voltage can be controlled by appropriately designing the noncrystal regions with respect to the other parameters. For example, necessary characteristics suitable for the application can be obtained by optimizing the thickness of the anodic oxidized film, the acceleration energy of ion implantation or other parameters. It is, however, difficult to arbitrarily adjust these parameters for respective devices formed on a same substrate. For example, in some applications, it is desired to form a transistor having a high withstand voltage and a transistor having a low withstand voltage but a high switching speed on a same substrate. In accordance with the present invention or the invention disclosed in Japanese patent disclosure No.Hei3-237100, the withstand voltage and the off-state current leakage can be improved by increasing the offset region. In the followings, an embodiment of forming transistors having different characteristics on a same substrate will be described.

Figure 9A:
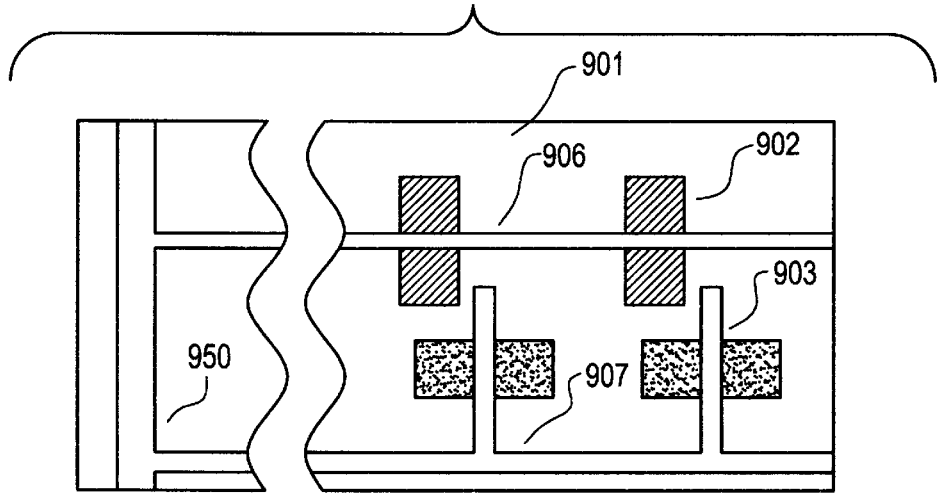
FIGS. 9(A) to 9(C) are plan views showing a method of manufacturing a thin film field effect transistor having a new structure equivalent to LDD regions in accordance with a fourth embodiment of the present invention.
Figure 9B:
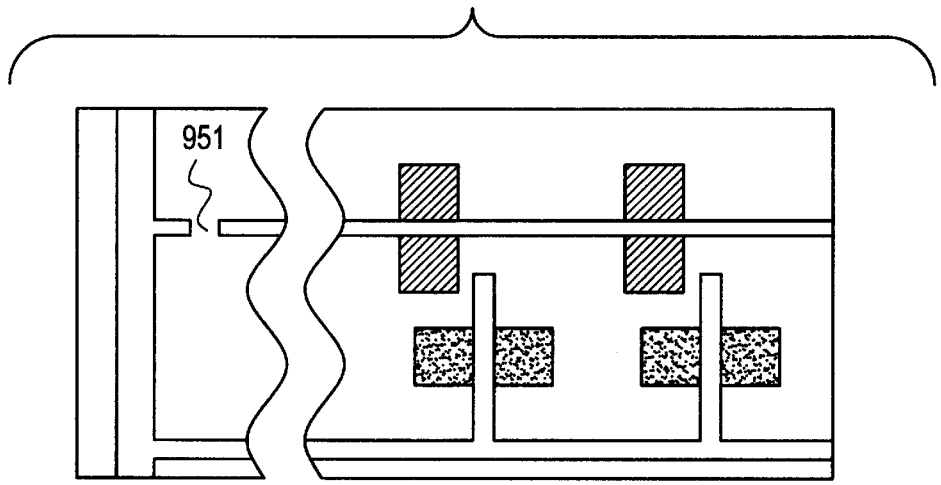
Figure 9C:
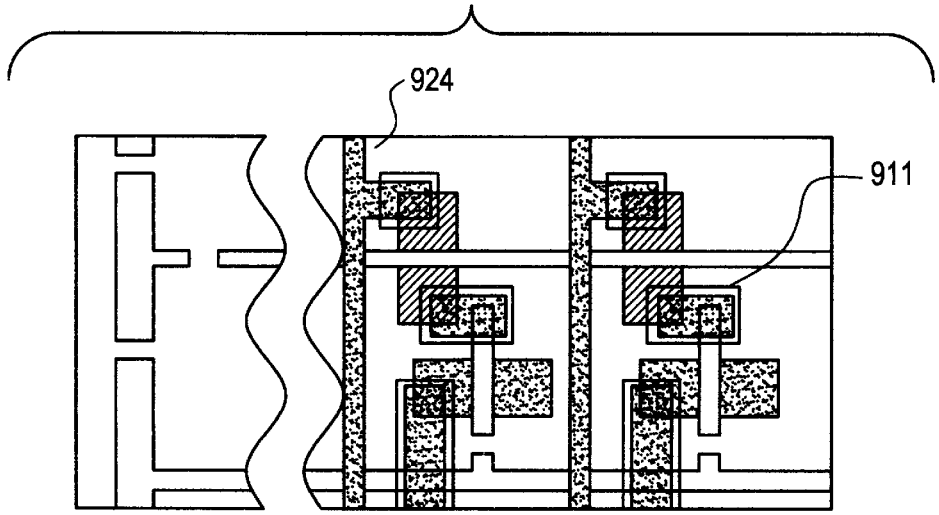
Figure 10A:
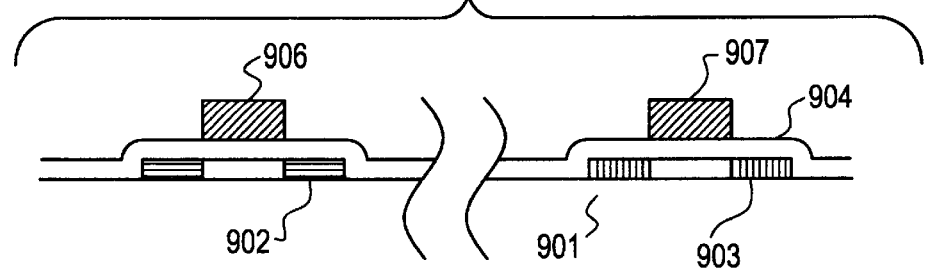
FIGS. 10(A) to 10(D) are cross sectional views showing a method of manufacturing a thin film field effect transistor having a new structure equivalent to LDD regions in accordance with a fourth embodiment of the present invention.
Figure 10B:
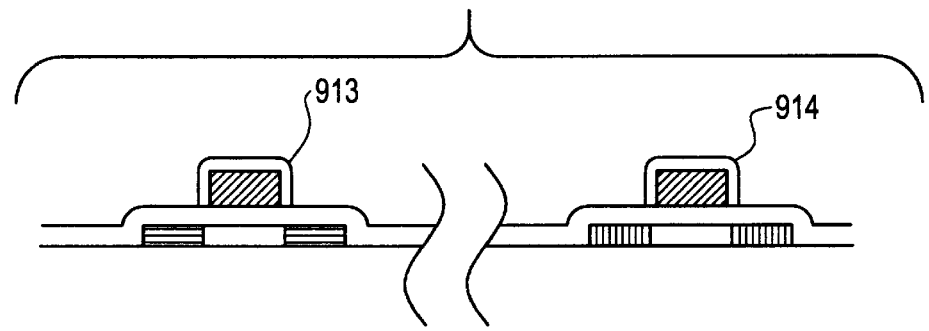
Figure 10C:
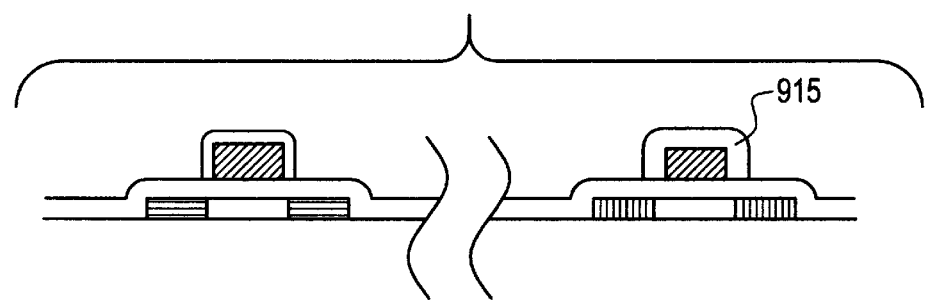
Figure 10D:
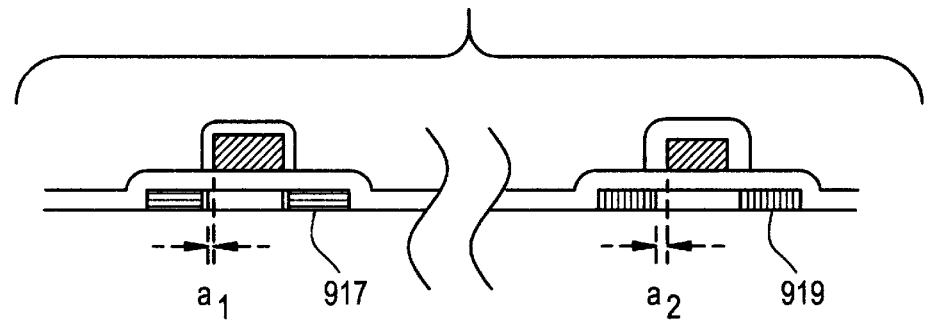

Referring now to FIGS. 9(A) to 9(C) and FIGS. 10(A) to 10(D), a method of manufacturing a pair of thin film field effect transistors in accordance with a fourth embodiment of the present invention will be explained. Particularly, the transistors are designed to be driver circuits for a liquid crystal display. The structure illustrated in FIGS. 9(A) and 10(A) is formed in the same manner as the structure shown in FIGS. 5(C) and 6(A). Namely, n-type and p-type transistors are formed on a glass substrate. Aluminum patterns 906 and 907 are anodic oxidized with a common line 950 as a positive electrode in the same manner as in the second embodiment. The maximum voltage, however, is 50V in this case. Aluminum oxide films 913 and 914 are then formed to a thickness of 60 nm.

Next, the conductive line connected to the gate electrode 906 of the n-type transistor is cut as depicted by numeral 951 in FIG. 9(B) by laser etching in order to disconnect the gate electrode 906 from the common line 950. In this condition, anodic oxidation is carried out again in the same manner with the common line 950 as the positive electrode. The maximum voltage is 250V in this case. As a result, the thickness of the oxide film enclosing the gate electrode of the p-type transistor is increased to a thickness of 300 nm as depicted by numeral 915 in FIG. 10(C).

The structure is then given laser annealing in the same condition as in the second embodiment in order to crystallize part of the impurity regions. The noncrystal region of the n-channel transistor (the left transistor) has little influence upon the operation. The aluminum oxide film 913, however, is necessary for avoiding damage by laser projection. The width of the noncrystal region of the p-channel transistor (the right transistor) is 150 to 200 nm. The width of the offset region of the p-channel transistor denoted by $a_2$ is 100 to 150 nm.

Subsequent steps are carried out in the same manner as those for the second embodiment so that redundant explanation of details is omitted. Namely, after separating the gate electrodes for the p-channel transistors, an interlayer insulating film is deposited by sputtering followed by opening contact holes by photolithography and providing necessary electrodes and wirings as denoted by 924 and 911 for example.

The offset region $a_1$ of the n-channel transistor is very narrow so that the switching speed is high while the off-state current is relatively large. On the other hand, the offset region $a_2$ of the p-channel transistor is relatively wide so that the switching speed is not so high while the off-state current is limited. This is very appropriate for use in driver transistors of a liquid crystal display as illustrated in FIG. 7(C) which is also the circuit diagram for FIG. 9(C). The n-type transistor is driven to turn on or off the p-type transistor which maintains charge accumulated in the capacitance of a pixel. For this purpose, the thickness of the aluminum oxide film 913 is selected to be 20 to 100 nm whereas the thickness of the aluminum oxide film 915 is selected to be 250 to 400 nm. There are other applications which require such transistors having different characteristics. For example, in the case of logic circuits such as shift registers, circuit portions for logic actions are desired to consist of high speed transistors and output stages thereof to consist of transistors having high with stand voltages.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, The present invention can be applied to semiconductor devices made of germanium semiconductors, silicon carbide semiconductors, gallium arsenic semiconductors or other suitable semiconductors in the same manner as those utilizing silicon semiconductors.

What is claimed is:

1. A method of manufacturing a plurality of insulated gate field effect semiconductor device comprising the steps of:

forming at least first and second semiconductor islands on an insulating surface;

forming a gate insulating layer on said first and second semiconductor islands;

forming at least first and second gate electrodes over said first and second semiconductor islands, respectively, with said gate insulating layer interposed therebetween;

introducing a first and a second impurity into said first and second semiconductor islands, respectively, with said first and second gate electrodes as masks;

oxidizing the external surface of said first and second gate electrodes which is formed over said first and second semiconductor islands in order to form an oxide layer thereon, wherein said oxidizing step is carried out in such a manner that the oxide layer of the first gate electrode formed over said first semiconductor island is thicker than the oxide layer of the second gate electrode formed over said second semiconductor island.

2. The method of claim 1 wherein first and second gate electrodes are subjected to an anodic oxidation in said oxidizing step, said anodic oxidation being extended to a longer period on the first gate electrode formed over said first semiconductor island on the second gate electrode formed over said second semiconductor island.

3. The method of claim 1 wherein said oxidizing step is carried out by anodic oxidation.

4. The method of claim 1 wherein said first and second gate electrodes comprise a metal or alloy thereof, said metal selected from the group consisting of titanium, aluminum, tantalum and chromium.

5. The method of claim 1 wherein said oxidizing step is conducted by a plasma oxidation.

* * * * *